United States Patent
Russell et al.

(10) Patent No.: US 7,754,588 B2
(45) Date of Patent: Jul. 13, 2010

(54) METHOD TO IMPROVE A COPPER/DIELECTRIC INTERFACE IN SEMICONDUCTOR DEVICES

(75) Inventors: Noel Russell, Malta, NY (US); Steven Sherman, Newton, MA (US); John J. Hautala, Beverly, MA (US)

(73) Assignee: TEL Epion Inc., Billerica, MA (US)

( * ) Notice: Subject to any disclaimer, the term of this patent is extended or adjusted under 35 U.S.C. 154(b) by 395 days.

(21) Appl. No.: 11/864,318

(22) Filed: Sep. 28, 2007

(65) Prior Publication Data
US 2009/0087969 A1  Apr. 2, 2009

(51) Int. Cl.
*H01L 21/425* (2006.01)

(52) U.S. Cl. ............... 438/514; 438/627; 257/E21.147

(58) Field of Classification Search ............... 438/514, 438/627, 643; 257/E21.12, E21.135, E21.147
See application file for complete search history.

(56) References Cited

U.S. PATENT DOCUMENTS

| | | | |
|---|---|---|---|
| 4,361,762 A | 11/1982 | Douglas | |
| 4,886,971 A | 12/1989 | Matsumura et al. | |
| 4,916,311 A | 4/1990 | Fuzishita et al. | |
| 5,907,780 A | 5/1999 | Gilmer et al. | |
| 6,174,793 B1 | 1/2001 | Tsai et al. | |
| 6,268,291 B1 | 7/2001 | Andricacos et al. | |
| 6,589,874 B2 | 7/2003 | Andricacos et al. | |
| 7,276,441 B1 * | 10/2007 | Cui et al. ............... | 438/654 |
| 7,288,491 B2 | 10/2007 | Collins et al. | |
| 2002/0130275 A1 | 9/2002 | Mack et al. | |
| 2005/0147762 A1 | 7/2005 | Dubin et al. | |
| 2005/0181621 A1 * | 8/2005 | Borland et al. ............ | 438/752 |
| 2005/0250346 A1 | 11/2005 | Schmitt | |
| 2005/0277246 A1 | 12/2005 | Kirkpatrick et al. | |
| 2005/0277301 A1 | 12/2005 | Huang et al. | |
| 2006/0006140 A1 | 1/2006 | Lakshmanan et al. | |
| 2007/0190784 A1 | 8/2007 | Cui et al. | |

FOREIGN PATENT DOCUMENTS

| | | |
|---|---|---|
| JP | 62296357 A | 12/1987 |
| WO | 2006052958 A2 | 5/2006 |

OTHER PUBLICATIONS

European Patent Office, International Search Report and Written Opinion received in corresponding International Application No. PCT/US2008/076621 dated Feb. 4, 2009, 14 pp.
Saitoh, Y. et al., Acceleration of cluster and molecular ions by TIARA 3 MV tandem accelerator, vol. 452, No. 1-2, Sep. 21, 2000, pp. 61-66, XP004210610, ISSN: 0168-9002.
Yamada, I. et al., Surface modification with gas cluster ion beams, Nuclear Instruments & Methods in Physics Research, vol. B79, Nov. 2, 1992, pp. 223-226, XP001031961, ISSN: 0168-583X.
Yamada, I. et al., Materials processing by gas cluster ion beams, vol. 34, May 30, 2001, pp. 231-295.

* cited by examiner

*Primary Examiner*—Asok K Sarkar
*Assistant Examiner*—Julia Slutsker
(74) *Attorney, Agent, or Firm*—Wood, Herron & Evans, LLP

(57) ABSTRACT

Embodiments of methods for improving a copper/dielectric interface in semiconductor devices are generally described herein. Other embodiments may be described and claimed.

7 Claims, 5 Drawing Sheets

METHOD TO IMPROVE A COPPER/DIELECTRIC INTERFACE IN SEMICONDUCTOR DEVICES

FIELD OF THE INVENTION

The invention relates generally to methods and processing systems for improved dual damascene integration structures for semiconductor integrated circuits.

BACKGROUND OF THE INVENTION

The semiconductor industry has had tremendous success in delivering ever more cost effective chips to market through the use of scaling. However, while scaling works well in device or front-end semiconductor processing, device wiring is not amenable to scaling and results in degraded interconnect resistance and/or capacitance. To alleviate this problem, the industry has been migrating to the use of a lower resistance conductor, such as copper (Cu), and is also introducing lower-k insulators (k=dielectric constant) to reduce capacitance in damascene interconnect and/or device structures. Newly developed insulators in the ultra-low-k (ULK) range (k<2.5) are generally characterized by a great deal of porosity (e.g., 30-50%). These materials are extremely fragile and difficult to integrate since they are susceptible to contamination from other sources.

In a dual-damascene (DD) structure, a single metal deposition step is used to simultaneously form Cu metal lines and vias. The Cu metal lines and vias are formed by filling recessed features, such as a trench, a via, or other interconnect structure, in a dielectric film or substrate. After filling, the excess Cu metal that is deposited outside the recessed feature is removed by a chemical-mechanical polishing (CMP) process, thereby forming a planar structure with metal interconnect inlays.

An interface exposed by Cu CMP, and subsequently capped by a dielectric layer, such as low-k or ULK insulators, is critical to the performance and reliability of copper interconnects on semiconductor devices. An interaction between the dielectric capping layer and the underlying copper often limits an electromigration reliability of the interconnect. The ability of this dielectric layer to serve as a barrier to copper diffusion and the cleanliness of the interface (especially presence of trace amounts of copper) between the dielectric capping layer and underlying dielectric layer in the interstices between copper lines can limit a dielectric breakdown reliability and line-to-line leakage performance of the interconnect.

BRIEF DESCRIPTION OF THE DRAWINGS

The present invention is illustrated by way of example and not as a limitation in the figures of the accompanying drawings.

DETAILED DESCRIPTION

There is a general need for improving the reliability of devices comprising copper and dielectric features, and in particular, conductive paths and dielectric regions between the conductive paths exposed by a planarization process. One way to improve reliability of devices is to getter metal impurities that may be present between conductive paths, resulting in an improved margin for line-to-line breakdown and electrical leakage performance. Metal impurities may be gettered between conductive paths, such as copper lines, by forming a phosphorus-doped barrier layer.

Figure 1:
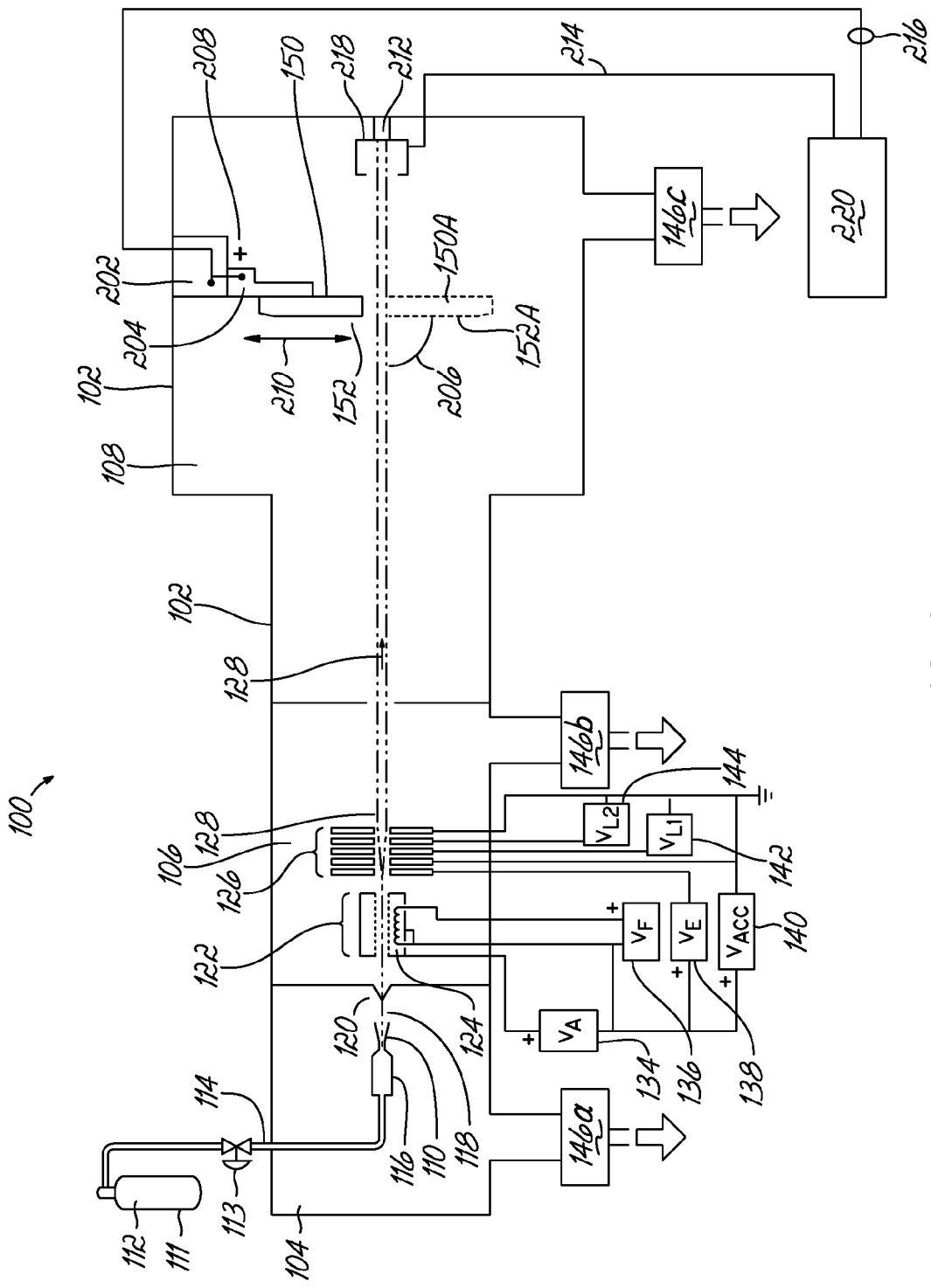
FIG. 1 is a diagrammatic view of a GCIB processing apparatus.

With reference to FIG. 1 a GCIB processing apparatus 100 includes a vacuum vessel 102 divided into three communicating chambers, a source chamber 104, an ionization/acceleration chamber 106, and a processing chamber 108. The chambers are evacuated to suitable operating pressures by vacuum pumping systems 146a, 146b, and 146c, respectively. A condensable source gas 112 (for example argon or $N_2$) stored in a gas storage cylinder 111 is admitted under pressure through gas metering valve 113 and gas feed tube 114 into stagnation chamber 116 and is ejected into the substantially lower pressure vacuum through a properly shaped nozzle 110. A supersonic gas jet 118 results. A condensable source gas 112 may be a gas that condenses at temperatures greater than 30 degrees Kelvin at one atmosphere whereas a non-condensable source gas may be a gas that condenses at temperatures less than or equal to 30 degrees Kelvin at one atmosphere. Suitable condensable source gases 112 include, but are not necessarily limited to phosphine, argon, nitrogen, carbon dioxide, oxygen, and other gases and mixtures thereof. Suitable non-condensable source gases include, but are not necessarily limited to helium, neon, hydrogen, and mixtures thereof.

Cooling, which results from the expansion in the jet, causes a portion of the gas jet 118 to condense into clusters, each comprising from several to several thousand weakly bound atoms or molecules. A gas skimmer aperture 120 partially separates the gas molecules that have not condensed into a cluster jet from the cluster jet so as to minimize pressure in the downstream regions where such higher pressures would be detrimental (e.g., ionizer 122, high voltage electrodes 126, and processing chamber 108).

After the supersonic gas jet 118 containing gas-clusters has been formed, the clusters are ionized in an ionizer 122. The ionizer 122 is typically an electron impact ionizer that produces thermoelectrons from one or more incandescent filaments 124 and accelerates and directs the electrons causing them to collide with the gas-clusters in the gas jet 118, where the jet passes through the ionizer 122. The electron impact ejects electrons from the clusters, causing a portion the clusters to become positively ionized. Some clusters may have more than one electron ejected and may become multiply ionized. A set of suitably biased high voltage electrodes 126 extracts the cluster ions from the ionizer, forming a beam, and then accelerates them to a desired energy (typically with acceleration potentials of from several hundred V to several tens of kV) and focuses them to form a GCIB 128. Filament power supply 136 provides filament voltage $V_f$ to heat the ionizer filament 124. Anode power supply 134 provides anode voltage $V_A$ to accelerate thermoelectrons emitted from filament 124 to cause them to irradiate the cluster containing gas jet 118 to produce ions. Extraction power supply 138 provides extraction voltage $V_E$ to bias a high voltage electrode to extract ions from the ionizing region of ionizer 122 and to form a GCIB 128. Accelerator power supply 140 provides acceleration voltage $V_{ACC}$ to bias a high voltage electrode with respect to the ionizer 122 so as to result in a total GCIB acceleration potential equal to $V_{ACC}$. One or more lens power supplies (142 and 144 shown for example) may be provided to bias high voltage electrodes with focusing voltages ($V_{L1}$ and $V_{L2}$ for example) to focus the GCIB 128.

A workpiece 152, which may be a semiconductor wafer or other workpiece to be processed by GCIB processing, is held on a workpiece holder 150, which can be disposed in the path of the GCIB 128. Since most applications contemplate the processing of large workpieces with spatially uniform results, a scanning system is desirable to uniformly scan the GCIB 128 across large areas to produce spatially homogeneous results.

The GCIB 128 is stationary, has a GCIB axis 129, and the workpiece 152 is mechanically scanned through the GCIB 128 to distribute the effects of the GCIB 128 over a surface of the workpiece 152.

An X-scan actuator 202 provides linear motion of the workpiece holder 150 in the direction of X-scan motion 208 (into and out of the plane of the paper). A Y-scan actuator 204 provides linear motion of the workpiece holder 150 in the direction of Y-scan motion 210, which is typically orthogonal to the X-scan motion 208. The combination of X-scanning and Y-scanning motions moves the workpiece 152, held by the workpiece holder 150 in a raster-like scanning motion through GCIB 128 to cause a uniform (or otherwise programmed) irradiation of a surface of the workpiece 152 by the GCIB 128 for processing of the workpiece 152. The workpiece holder 150 disposes the workpiece 152 at an angle with respect to the axis of the GCIB 128 so that the GCIB 128 has an angle of beam incidence 206 with respect to the workpiece 152 surface. The angle of beam incidence 206 may be any suitable angle, but is typically 90 degrees or near 90 degrees. During Y-scanning, the workpiece 152 and the workpiece holder 150 move from the position shown to the alternate position "A" indicated by the designators 152A and 150A respectively. Notice that in moving between the two positions, the workpiece 152 is scanned through the GCIB 128 and in both extreme positions, is moved completely out of the path of the GCIB 128 (over-scanned). Though not shown explicitly in FIG. 1, similar scanning and over-scan is performed in the (typically) orthogonal X-scan motion 208 direction (in and out of the plane of the paper).

A beam current sensor 218 is disposed beyond the workpiece holder 150 in the path of the GCIB 128 so as to intercept a sample of the GCIB 128 when the workpiece holder 150 is scanned out of the path of the GCIB 128. The beam current sensor 218 is typically a faraday cup or the like, closed except for a beam-entry opening, and is typically affixed to the wall of the vacuum vessel 102 with an electrically insulating mount 212.

A controller 220, which may be a microcomputer based controller connects to the X-scan actuator 202 and the Y-scan actuator 204 through electrical cable 216 and controls the X-scan actuator 202 and the Y-scan actuator 204 so as to place the workpiece 152 into or out of the GCIB 128 and to scan the workpiece 152 uniformly relative to the GCIB 128 to achieve desired processing of the workpiece 152 by the GCIB 128. Controller 220 receives the sampled beam current collected by the beam current sensor 218 by way of lead 214 and thereby monitors the GCIB and controls the GCIB dose received by the workpiece 152 by removing the workpiece 152 from the GCIB 128 when a predetermined desired dose has been delivered.

Figure 2:
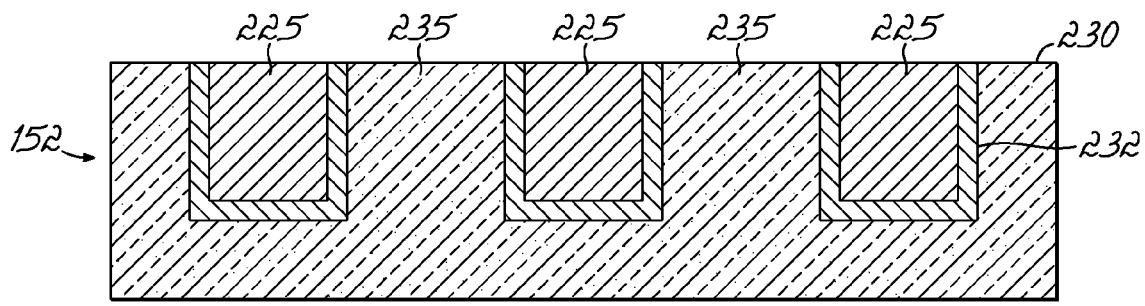
FIG. 2 is a cross-sectional view of a planarized workpiece illustrating conductive paths formed in recessed features.

With reference to FIG. 2 and in accordance with a representative embodiment, a cross-sectional view of a workpiece 152 with a planarized top surface 230 illustrating conductive paths 225 formed in recessed features is shown. A planarization process provides the planarized top surface 230 to create a uniform surface while improving the optical resolution of subsequent lithography steps. The planarization process may be terminated by detecting the presence of the top of a dielectric region 235 or by monitoring a planarization process time to determine an appropriate endpoint. The conductive paths 225 may be formed from a damascene process or a dual damascene process by etching a plurality of interconnect holes, known as vias, followed by a trench etch into a workpiece 152 substrate, or a layer over a substrate such as a pre-metal dielectric (PMD), or an inter-layer dielectric (ILD) layer. The workpiece 152 may comprise silicon, germanium (Ge), or a III-V semiconductor such as gallium arsenide (GaAs) or indium antimonide (InSb). Additionally, a top layer of the workpiece 152 may be formed from an epitaxial layer, a monocrystalline substrate or from a silicon-on-insulator (SOI) layer.

The series of interconnect holes and trenches formed through one or more etching processes may be referred to as recessed features. The recessed features are filled with a metal such as copper (Cu) using an electroplating process or a physical vapor deposition process (PVD), which is subsequently planarized using a process such as chemical mechanical polishing (CMP), electropolishing, or ion milling to expose a dielectric of the workpiece 152, the PMD, and/or the ILD, and the conductive paths 225.

The conductive paths 225 may be lined with a liner 232 to limit the amount of material transfer between the conductive path 225 and the dielectric region 235. The liner 232 may be formed of one or more layers of tantalum, tantalum nitride, titanium, titanium nitride, tungsten, and/or tungsten nitride. The liner 232 may be formed using layering techniques including PVD, atomic layer deposition (ALD), chemical vapor deposition (CVD), plasma enhanced chemical vapor deposition (PECVD), thermal deposition, and evaporation.

According to embodiments of the invention, schematically depicted in cross-section in FIGS. 2A-4B, which will be discussed in greater detail below, a phosphorus-doped barrier layer 265 is formed over the planarized top surface 230 to provide phosphorus dopant 270 at an interface 260 between the conductive paths 225 and the phosphorus-doped barrier layer 265, also referred to as the copper/barrier interface 260. The phosphorus-doped barrier layer 265 may contain phosphorus dopant 270 throughout the layer 265, either uniformly or in graded fashion. In addition, the phosphorus-doped layer 265 may be formed over the planarized top surface 230 with an un-doped barrier layer 240 residing over the phosphorus-doped barrier layer 265. In further embodiments, the phosphorus dopant 270 may penetrate into one or both of the conductive paths 225 and dielectric regions 235, effectively blurring the interface 260.

Figure 2A:
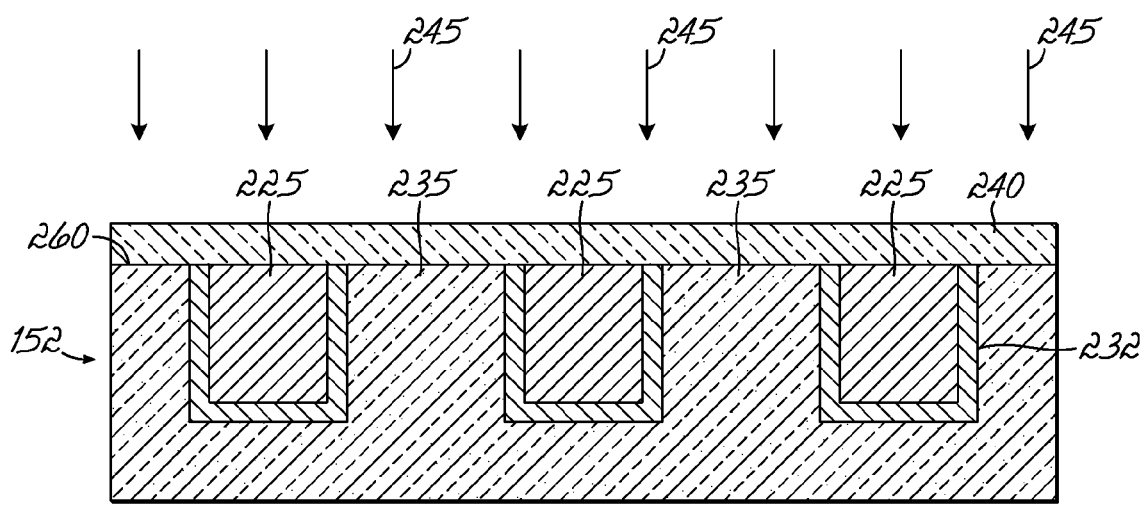
FIG. 2A is a cross-sectional schematic view illustrating formation of an un-doped barrier layer on the planarized workpiece of FIG. 2.

According to one embodiment, FIG. 2A depicts depositing an un-doped barrier layer 240 over the planarized top surface 230 of the workpiece 152 of FIG. 2 by a film-forming source 245. The un-doped barrier layer 240 is deposited as a conformal layer on the planarized top surface 230 using methods known to persons having ordinary skill in the art, such as CVD, PECVD, high density plasma chemical vapor deposition (HDPCVD), metal organic chemical vapor deposition (MOCVD), ALD, and PVD. By way of example and not limitation, the film forming source 245 may comprise one or more of silicon, nitrogen, boron, or carbon, and the un-doped barrier layer 240 may comprise one or more film layers such as silicon nitride, nitrogen-doped silicon nitride, silicon carbide, silicon carbon nitride, boron carbon nitride, and/or boron nitride. In one embodiment, a thickness of the un-doped barrier layer 240 is between 20 and 200 angstroms. In another embodiment, the thickness of the un-doped barrier layer 240 is between 5 and 20 angstroms.

Figure 2B:
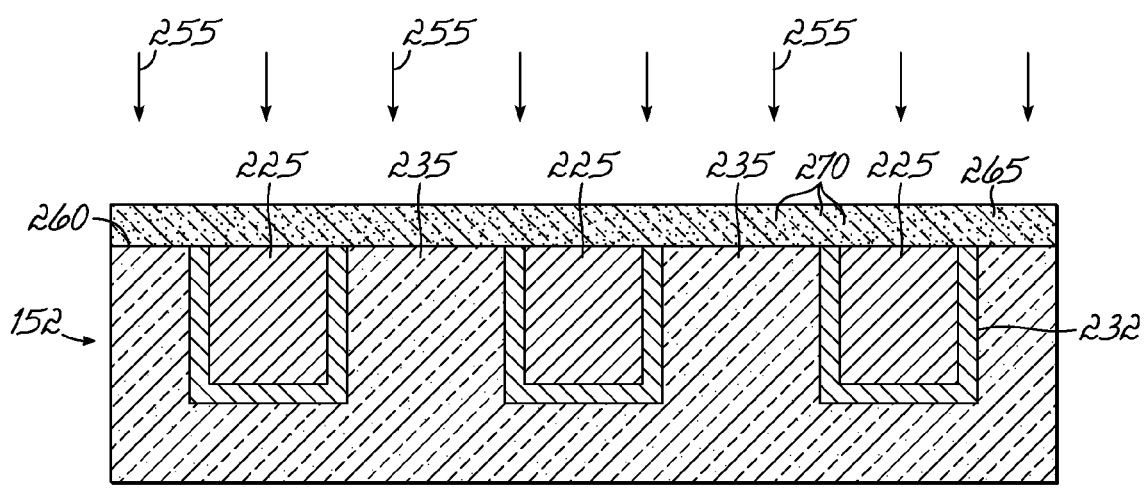
FIG. 2B is a cross-sectional schematic view illustrating doping of the barrier layer of FIG. 2A.

FIG. 2B schematically illustrates doping the un-doped barrier layer 240 of the workpiece 152 in FIG. 2A using a phosphorus source 255 to convert the layer 240 to a phosphorus-doped barrier layer 265. Thus, FIGS. 2A-2B depict sequential steps for forming a phosphorus doped barrier layer 265, in which the first step comprises depositing an un-doped barrier layer 240, and the second step comprises implanting or infusing a phosphorus dopant 270 into the previously deposited un-doped barrier layer 240. By the method depicted in FIGS. 2A-2B, phosphorus dopant 270 is provided at the interface 260 adjacent the conductive paths 225. The phosphorus source 255 may be a partial pressure of a phosphorus comprising gas either in molecular or ionized form, a stream of ions in atomic or in ionized form, or a stream of ionized gas clusters comprising hundreds or thousands of P atoms or molecules. The phosphorus source 255 may originate from a single species such as phosphine ($PH_3$) or it may comprise a plurality of species including phosphine and a condensable source such as helium, argon, nitrogen, carbon dioxide, oxygen, nitrogen trifluoride, and other gases and/or gas mixtures.

Figure 3:
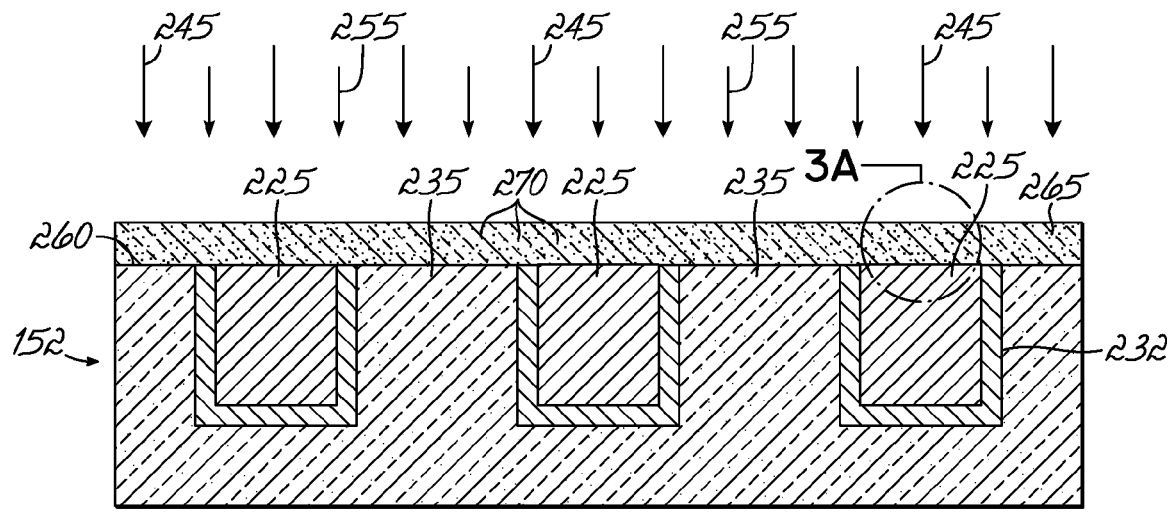
FIG. 3 is a cross-sectional schematic view illustrating formation of a doped barrier layer on the planarized workpiece of FIG. 2.

According to another embodiment, FIG. 3 depicts depositing a phosphorus-doped barrier layer 265 over the planarized top surface 230 of the workpiece 152 of FIG. 2 by a film-forming source 245 combined with a phosphorus source 255. Thus, FIG. 3 depicts concurrently doping the barrier layer as it is being deposited. By the method depicted in FIG. 3, as with FIGS. 2A-2B, phosphorus dopant 270 is provided at the interface 260 adjacent the conductive paths 225. The phosphorus source 255 may be integral with the film-forming source 245, i.e., the gases may be admixed in a source chamber and fed concurrently as a gas mixture to a processing or deposition chamber, or the phosphorus source 255 may be contained in a separate source chamber from the film-forming source 245, with the sources 245 and 255 being combined either in a transfer line feeding the processing/deposition chamber or within the processing/deposition chamber itself.

Figure 3A:
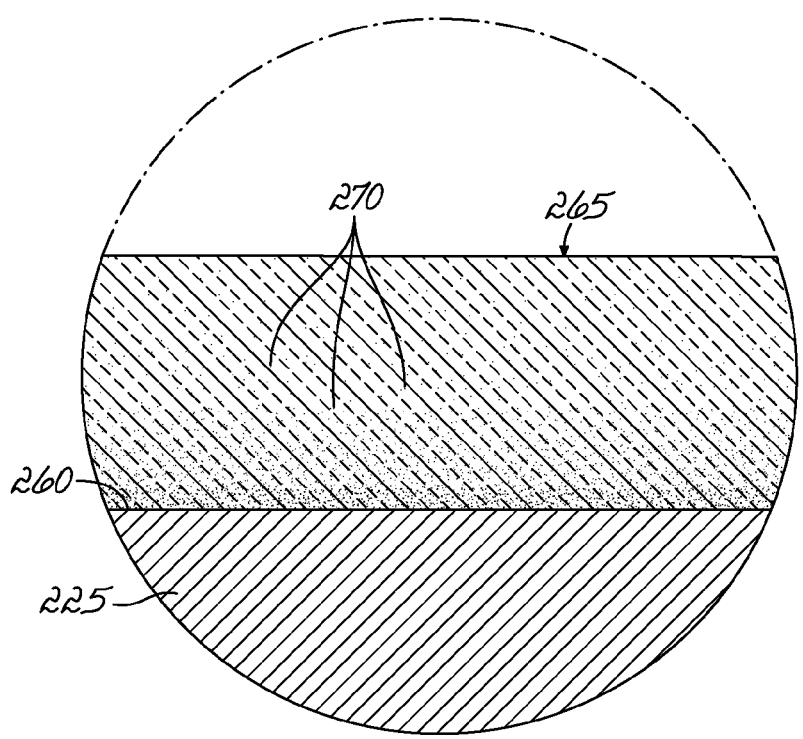
FIG. 3A is an enlarged view of a portion of FIG. 3 depicting a dopant gradient.

The phosphorus source 255 may be uniformly incorporated as the dopant 270 in the phosphorus-doped barrier layer 265, or the phosphorus source 255 may be incorporated so that the concentration of dopant 270 is graded, as shown in the enlarged view of FIG. 3A, wherein the concentration of dopant 270 is non-uniform as a function of film thickness. For example, as shown, a concentration of phosphorus dopant 270 at the bottom of the phosphorus-doped barrier layer 265 may be higher than the concentration of phosphorus dopant 270 at the top of the phosphorus-doped barrier layer 265, thereby maximizing the phosphorus dopant concentration at the interface 260 between the conductive paths 225 and the phosphorus-doped barrier layer 265. Means for forming a graded concentration of an element during or after deposition are known to those of skill in the art, for example, continuously or periodically reducing the flow rate of the grading element and/or successively lowering the dosage of the grading element.

The phosphorus source 255 may be delivered by a system selected from the group consisting of a thermal treatment system, a plasma treatment system, and a gas cluster ion beam system to a dose from about $1\times10^{14}$ atoms/$cm^2$ to about $5\times10^{16}$ atoms/$cm^2$. Alternatively, the phosphorus-doped barrier layer 265 may be formed so as to comprise between 0.1 atomic % and 10 atomic % phosphorus. In one embodiment of the invention, a GCIB is used to deposit the phosphorus-doped barrier layer 265 using a film forming source 245 and phosphorus source 255.

Depending on the system and method used, the phosphorus dopant 270 may be incorporated or infused into a previously deposited barrier layer 240 or into the phosphorus-doped barrier layer 265 as it is deposited. In addition, phosphorus dopant 270 from phosphorus source 255 may be optionally added after the phosphorus-doped barrier layer 265 is formed, to incorporate or infuse additional dopant and/or to alter the concentration gradient. If needed, the workpiece 152 may be annealed using methods known to one skilled in the art to reduce damage created by an ion implantation process.

Figure 4A:
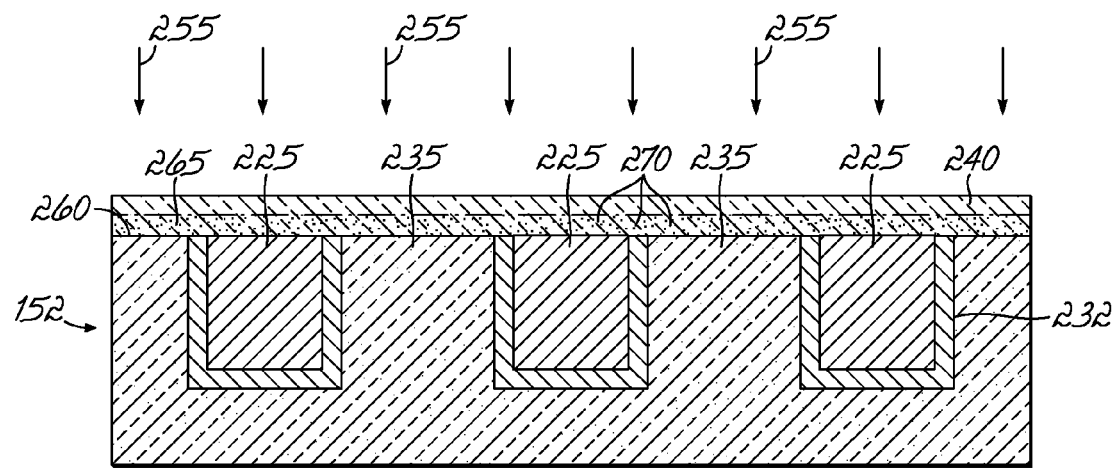
FIG. 4A is a cross-sectional schematic view illustrating doping of a portion of the barrier layer of FIG. 2A at the interface.

According to an alternative embodiment depicted in FIG. 4A, phosphorus dopant 270 may be infused or incorporated through the un-doped barrier layer 240 of FIG. 2A into a lower portion thereof to form the phosphorus-doped barrier layer 265 at the interface 260, while leaving an upper portion as the un-doped barrier layer 240. Thus, the barrier structure formed on the substantially planar surface 230 includes a phosphorus doped portion (phosphorus-doped barrier layer 265) adjacent the interface 260 with the planarized top surface 230 and an un-doped portion (un-doped barrier layer 240) furthest from the interface 260 with the planarized top surface 230, whereby phosphorus dopant 270 is provided adjacent the underlying conductive paths 225, and an un-doped barrier portion is provided for interfacing with subsequent material to be applied over the barrier structure. The same barrier structure could also be formed by depositing an un-doped barrier layer 240 over the phosphorus-doped barrier layer 265 of the workpiece 152 depicted in FIGS. 2B or 3.

Figure 4B:
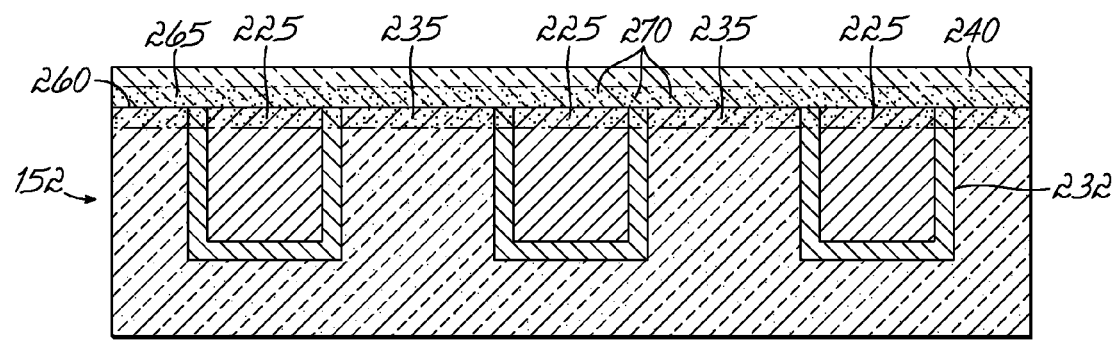
FIG. 4B is a cross-sectional schematic view illustrating further doping of the structure of FIG. 4B to infuse the dopant into the conductive paths.

According to another alternative embodiment depicted in FIG. 4B, the phosphorus dopant 270 may be further incorporated or infused into the conductive paths 225 and/or dielectric regions 235. By providing phosphorus dopant 270 above and below the interface 260, the interface 260 is effectively blurred to provide better transition properties from the conductive paths 225 and/or dielectric regions 235 to the phosphorus-doped barrier layer 265. GCIB is particularly effective for infusing a phosphorus dopant 270 into a barrier layer 240 and/or 265 with minimal damage to the workpiece 152.

Figure 5:
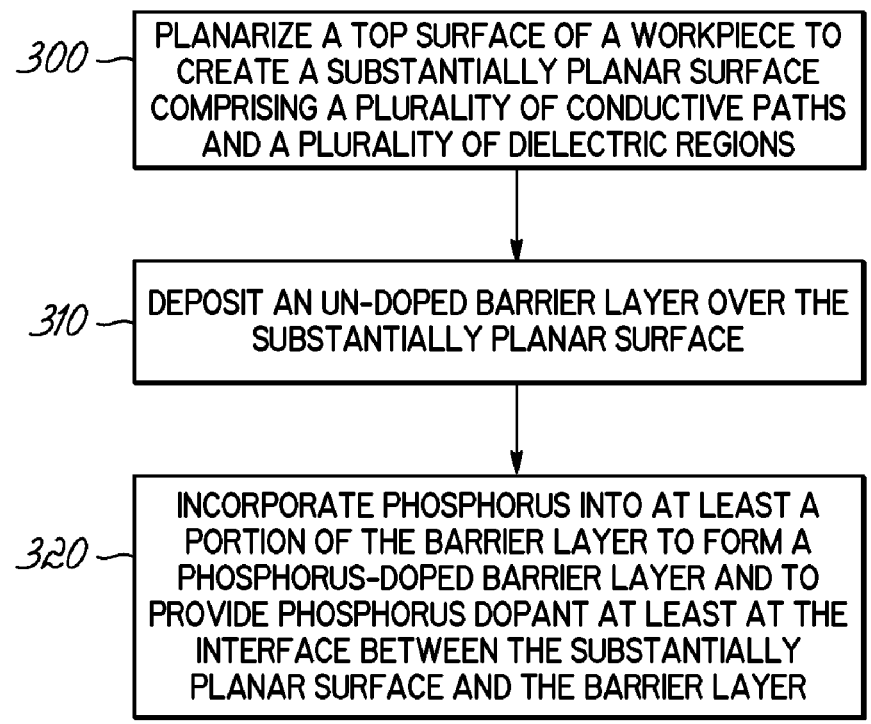
FIG. 5 is a flowchart showing one embodiment of a method of providing an improved copper/dielectric interface on a workpiece.

FIG. 5 is a flowchart showing one embodiment of a method of providing an improved copper/barrier interface 260 on a workpiece 152. In element 300, a workpiece 152 is planarized to form a substantially planar surface (planarized top surface 230) with conductive paths 225 and dielectric regions 235. Although not depicted, the planarized top surface 230 may optionally be pre-treated to reduce or minimize contaminants from the planarized top surface 230. In one example, the pre-treatment may be a wet chemical cleaning process to remove residual particles and/or material from the planarized top surface 230. The wet chemical cleaning process may use a post-CMP cleaning chemistry comprising de-ionized water, benzotriazine, and citric acid, or a solution particularly designed for post-CMP cleaning such as an ESC-700 series product manufactured by ATMI.

In another example, the pre-treatment may be an infusion etching process performed by a GCIB tool to modify or remove a portion of material from the planarized top surface 230. In another example, the pre-treatment may be a sputtering process performed by a PVD tool to modify or remove a portion of material from the planarized top surface 230. In element 310, an un-doped barrier layer 240 is deposited on the planarized top surface 230. In element 320, phosphorus is incorporated, for example infused, into at least a portion of the barrier layer 240 to form a phosphorus-doped barrier layer 265 and to provide phosphorus dopant at least at the interface 260 between the planarized top surface 230 and the barrier layer 240 to getter metal contaminants in the dielectric regions 235 and to minimize electromigration in the conductive paths 225.

Figure 6:
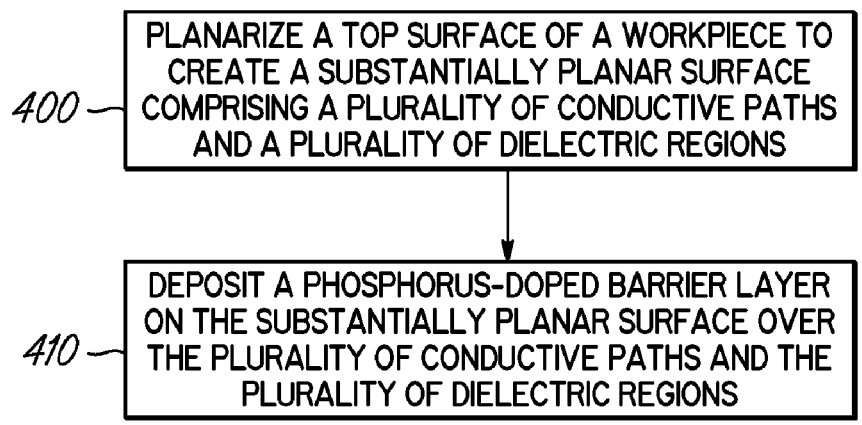
FIG. 6 is a flowchart showing an alternative embodiment of a method of providing an improved copper/dielectric interface on a workpiece.

FIG. 6 is a flowchart showing another embodiment of a method of providing an improved copper/dielectric interface 260 on a workpiece 152. In element 400, a top surface of a workpiece 152 is planarized to create a substantially planar surface (planarized top surface 230) comprising a plurality of conductive paths 225 and a plurality of dielectric regions 235. In element 410, a phosphorus-doped barrier layer 265 is deposited on the planarized top surface 230 over the plurality of conductive paths 225 and the plurality of dielectric regions 235. Again, phosphorus dopant is provided at the interface 260 between the planarized top surface 230 and the barrier layer 265 to getter metal contaminants in the dielectric regions 235 and to minimize electromigration in the conductive paths 225.

A plurality of embodiments for methods to improve copper/dielectric interfaces of semiconductor devices has been described. The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or upper layer is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

In the description and claims, the terms "coupled" and "connected," along with their derivatives, are used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of incorporating phosphorus in a device structure, the method comprising:
    planarizing a top surface of a workpiece to create a substantially planar surface comprising a plurality of conductive paths and a plurality of dielectric regions;
    depositing a barrier layer over the substantially planar surface thereby forming an interface between the substantially planar surface and the barrier layer; and
    doping at least a portion of the barrier layer adjacent the interface with phosphorus to form a phosphorus-doped barrier layer and to provide phosphorus dopant at least at the interface between the substantially planar surface and the barrier layer,
    wherein the doping is performed after the depositing, and includes infusing the phosphorus into the barrier layer, the plurality of dielectric regions, and the plurality of conductive paths using a gas cluster ion beam to getter metal contaminants in the dielectric regions and to minimize electromigration in the conductive paths.

2. The method of claim 1, wherein the barrier layer is selected from the group consisting of silicon nitride, silicon carbide, nitrogen doped silicon carbide, boron carbon nitride, and boron nitride.

3. The method of claim 2, wherein a thickness of the barrier layer is approximately between 20 angstroms and 200 angstroms.

4. The method of claim 1, further including a pre-treatment to modify or remove a portion of material from the planarized top surface.

5. The method of claim 1, further including a pre-treatment to remove contaminants from the planarized top surface.

6. The method of claim 1, wherein the phosphorus-doped barrier layer contains between 0.1 atomic % and 10 atomic % phosphorus.

7. The method of claim 1, wherein a thickness of the barrier layer is approximately between 5 angstroms and 20 angstroms.

* * * * *